United States Patent [19]

Marlor

[11] 4,053,863
[45] Oct. 11, 1977

[54] ELECTROPHOTOGRAPHIC PHOTOCONDUCTIVE PLATE AND THE METHOD OF MAKING SAME

[75] Inventor: Guy A. Marlor, Palo Alto, Calif.

[73] Assignee: Varian Associates, Inc., Palo Alto, Calif.

[21] Appl. No.: 272,241

[22] Filed: July 17, 1972

Related U.S. Application Data

[63] Continuation of Ser. No. 149,821, June 3, 1971, abandoned, which is a continuation of Ser. No. 721,331, April 15, 1968, abandoned.

[51] Int. Cl.² .................................................. H01L 31/08
[52] U.S. Cl. .................................. 338/15; 96/1.5 R; 252/301.6 R
[58] Field of Search .......... 96/1.5; 252/501, 301.6 R; 264/61, 62; 313/92 PH, 94; 338/15, 19

[56] References Cited

U.S. PATENT DOCUMENTS

| | | | |
|---|---|---|---|
| 2,663,636 | 12/1953 | Middleton | 95/1.9 |
| 2,765,385 | 10/1956 | Thomson | 201/63 |
| 2,930,999 | 3/1960 | VanSanten et al. | 338/15 |
| 2,937,353 | 5/1960 | Wasserman | 252/501 X |
| 3,052,539 | 9/1962 | Greig | 96/1 |
| 3,151,982 | 10/1964 | Corrsin | 96/1.5 X |
| 3,205,408 | 3/1970 | Brodie | 355/16 |
| 3,238,150 | 3/1966 | Behringer et al. | 252/501 |
| 3,248,261 | 4/1966 | Narkon et al. | 338/15 X |
| 3,288,603 | 11/1966 | Corrsin | 96/1 |
| 3,288,604 | 11/1966 | Corrsin | 96/1 |
| 3,460,476 | 8/1969 | Swigert et al. | 96/1.5 X |
| 3,507,646 | 4/1970 | Wood et al. | 96/1.5 X |
| 3,510,298 | 5/1970 | Lane | 96/1 |
| 3,617,265 | 11/1971 | Petruzzella | 96/1 |
| 3,653,890 | 4/1972 | Selmiya et al. | 355/3 X |

FOREIGN PATENT DOCUMENTS

| | | | |
|---|---|---|---|
| 1,517,118 | 2/1968 | France | 338/15 |
| 106,419 | 11/1963 | Netherlands | 252/501 |
| 1,079,065 | 8/1967 | United Kingdom | 338/15 |

OTHER PUBLICATIONS

R. H. Beebe, "Photoconductivity of the Sulfide, Selenide, and Telluride of Zinc or Cadmium" *IRE*, Aug. 5, 1955.

"Electrostatic Latent Image Photography" Quarterly Engineering Reports Nos. 1-6, Dec. 1, 1959-Feb. 28, 1961, General Electric Laboratories Air Force Contract No. AF33(616)-6746.

S. Kimura et al., "Cadmium Sulfide Photoconductive Sintereal Films" National Technical Report, vol. 6, No. 1, Mar. 1960, pp. 11-17.

*Primary Examiner*—C. L. Albritton
*Attorney, Agent, or Firm*—Stanley Z. Cole; Leon F. Herbert; Edward J. Radlo

[57] ABSTRACT

In an electrophotographic camera, a photon image to be recorded is focused through an optically transparent substrate and transparent electrode onto the back surface of a photoconductive layer. The charge-retentive surface of an electrographic recording paper is disposed adjacent the photoconductive layer and the conductive backing of the paper is connected to an electrode for impressing a charge transfer potential across the photoconductor layer and the charge-retentive layer of the paper. When the potential is impressed across the photoconductor, increased conduction caused in the photoconductor by the photon image to be recorded are establish a charge transfer to the charge-retentive surface of the recording paper to form a charge image of the object to be recorded. The charge image is subsequently developed by applying charged toner particles to the image for developing same. The photoconductive layer comprises a substantially continuous layer of electrically interconnected crystals of active photoconductive material coated and bound together with a lead sealing glass interstitially disposed of the interconnected crystals. The resultant photoconductive layer has improved strength and resistance to abrasion while producing acceptable photographic images. The photoconductive layer is produced by heating a stratum including particles of lead sealing glass together with particles of photoconductive material in the presence of a molten solvent and proportions of one or more activators. The sealing glass comprises between about 9% and about 31% by weight of the matrix.

29 Claims, 3 Drawing Figures

ELECTROPHOTOGRAPHIC PHOTOCONDUCTIVE PLATE AND THE METHOD OF MAKING SAME

This is a continuation of abandoned application Ser. No. 149,821 filed June 3, 1971 which is a continuation of Ser. No. 721,331 filed Apr. 15, 1968 and now abandoned.

DESCRIPTION OF THE PRIOR ART

Heretofore, photoconductive layers have been produced by forming a stratum including particles of a material selected from the group consisting of sulphides, selenides and sulphoselenides of cadium together with a solvent, recrystallizing said material, and incorporating into particles of material activator proportions of a halide and activator proportions of a metal selected from a group consisting of copper and silver. The resultant layer is a substantially continuous layer of interlocked crystals of photoconductive material. Such a sintered photoconductive material is described in U.S. Pat. No. 2,765,385, issued Oct. 2, 1956.

The problem with this prior art photoconductive material is that it is relatively fragile and non-resistant to abrasion, thereby precluding its use as a camera plate in an electrographic camera. The abrasion of the photoconductive surface in such an application would produce surface scratches and transfer of the photoconductive layer to the electrophotographic recording paper, thereby rendering the photoconductive camera plate unuseable.

Others have constructed xerographic plates of copper and chlorine-doped cadmium sulphide photoconductive powder incorporated in an acrylic resin consisting of n-butyl and isobutyl methacrylate. The acrylic resin served as a binder for the photocondutive particles and comprised approximately 11% by weight of the layer. The layer was formed by mixing the photoconductive powder and the acrylic resin in xylene to form a slurry. The slurry was applied to a tin oxide coated borosilicate glass substrate and air-dried and further dried at 80° C for several hours. The resultant photoconductive layer had improved mechanical stability over the aforementioned photoconductive layer but was found to have greatly reduced ASA speed, as of 1/100th of that of the aforedescribed prior art plate. Such a photoconductive plate is described in an article titled "Photoinduced Discharge Characteristics of Cadmium Sulphide Binder Layers in the Xerographic Mode" appearing in the Journal of Applied Physics, Vol. 36, No. 11, of November, 1965, pp 3475–3480. The problem with using such a photoconductor as an electrographic camera plate is that is produces rather speckled images due to a lack of uniformity of the resultant layer, it has a relatively high dark background current, and is sensitive to the presence of moisture which tends to alter its photoconductive properties and to give rise to excessive dark conductivity. In addition, this latter type of photoconductive plate suffers from memory effects, thereby precluding its use in a camera wherein the time interval between successive picture frames is desired to be as short as possible.

Therefore, the need exists for an improved photoconductive plate which will have relatively high ASA speeds, will be mechanically strong and resistant to abrasion, and which will be highly homogeneous and free of surface blemish and defects while providing relatively little memory and having very low dark current.

SUMMARY OF THE PRESENT INVENTION

The principal object of the present invention is the provision of an improved photoconductive layer and method of making same.

One feature of the present invention is the provision of a sintered photoconductor comprising a layer of substantially continuous polycrystalline matrix of interrelated particles of crystalline material selected from the group consisting of sulphides, selenides, tellurides and sulphoselenides of a member of the group consisting of zinc and cadmium, and containing activator and incorporating a glass binder interstatially disposed of said polycrystalline matrix, whereby a mechanically stable abrasion-resistant, high-speed photoconductive layer is formed having low memory and low dark current characteristics.

Another feature of the present invention is the same as the preceding feature wherein the photoconductive particles comprise crystals of cadmium sulphide containing activator proportions of chloride and copper and wherein the glass binder is a lead sealing glass.

Another feature of the present invention is the same as any one or more of the preceding features wherein the photoconductive layer is produced by a method including the steps of forming a layer including particles of glass mixed together with particles of material selected from the group consisting of sulphide, tellurides, selenides and sulphoselenides of a member of the group consisting of zinc and cadmium, and a solvent, and firing the layer to effect some recrystallization of the material of the particles, and to melt the glass to cause it to be disposed in the interstices between the particles.

Another feature of the present invention is the same as the preceding feature wherein the glass particle have a softening temperature between 50° and 250° C below the temperature at which the mixed particles are heated for melting the solvent present.

Other features and advantages of the present invention will become apparent upon a perusal of the following specification taken in connection with the accompanying drawings wherein:

DESCRIPTION OF THE PREFERRED EMBODIMENTS

Figure 1:
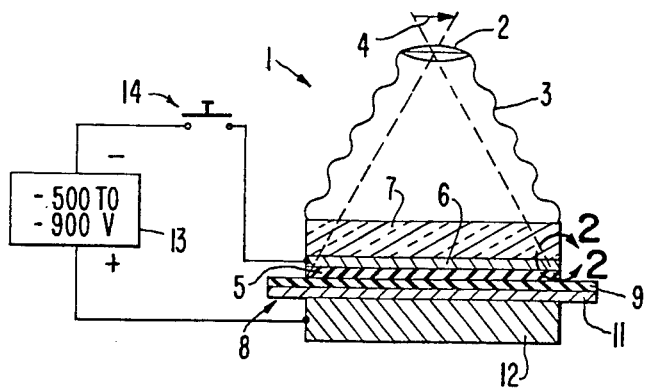
FIG. 1 is a schematic line diagram, partly in section and partly in block diagram form, depicting an electrophotographic camera incorporating features of the present invention.

Referring now to FIG. 1, there is shown an electrophotographic camera 1 incorporating features of the present invention. The camera 1 includes a lens 2 disposed at one end of a dark box 3 for focusing the light obtained from an object 4 onto the back side of a photoconductive layer 5 disposed at the image plane of the lens 2. The photoconductive layer 5, as of 20 to 100 microns, is deposited over an optically transparent conductive electrode 6 which in turn is supported from an optically transparent substrate 7, as of borosilicate glass plate ¼ inch thick. A suitable transparent conductive electrode structure 6 comprises a tin oxide coating having a resistivity of 50 ohms per square and having a transparency in the optical range, greater than 95%. Other suitable conductive transparent electrodes 6 include this metal films of chromium and gold.

An electrographic recording paper 8 is disposed adjacent the photoconductive layer 5 with the charge-retentive surface 9 of the paper 8 disposed adjacent the photoconductive layer 5. The conductive layer 11 of the paper 8 is disposed facing a conductive electrode structure 12 for uniformly pressing the charge-retentive surface 9 of the paper 8 into nominal contact with the surface of the photoconductor 5. A source of potential, as of −500 to −900 volts, is connected across electrodes 6 and 12 via the intermediary of a timing switch 14.

In operation, the image of the object 4 to be photographed is focused upon the photoconductive layer 5. The timing switch 14 is closed for the appropriate exposure time determined by the available light intensity and the speed of the photoconductive layer 5. During the exposure time, electrons liberated within the photoconductive layer 5 by the incident light image are caused to be transferred through the photoconductive layer 5 into the charge-retentive surface 9 of the electrographic paper 8. In this manner, a charge image of the object 4 is produced in the charge-retentive surface 9 of the paper. The charge image is then developed by removing the paper 8 from the camera 1 and applying positively charged toner particles to the charge image for developing same. The toner particles may be suspended in air or in a liquid dielectric vehicle. Alternatively, the polarity of the source 13 may be reversed to produce positive charge images on the charge retentive surface 9.

The photoconductor 5 is also sensitive to invisible radiation; i.e., photon of energy outside the visible range of wavelengths. For example, the photoconductor is useful for photographing X-ray or neutron images. In such latter applications, the transparent electrode 6 and substrate 7 need only be transparent to the rays which are to form the image on the photoconductor 5.

Figure 2:
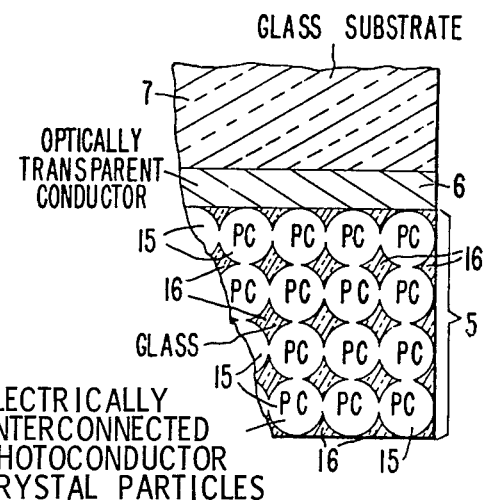
FIG. 2 is an enlarged view of a portion of the structure of FIG. 1 delineated by line 2—2.

Referring now to FIG. 2, there is shown the structural detail of the photoconductive layer 5 of the present invention. The photoconductive layer 5 comprises a substantially continuous polycrylstalline layer of a matrix of interrelated photoconductive particles of crystalline material selected from the group consisting of sulphides, tellurides, selenides, and sulphoselenides of a member of the group consisting of zinc and cadmium and containing activator proportions of a halide plus activator proportions of a member of the group consisting of copper and silver. A lead sealing glass binder material 16 is interstitially disposed of the polycrystalline matrix 15, thereby binding the matrix together to make the matrix mechanically stable and resistant to abrasion. The photoconductive particles matrix 15 are interrelated with neighboring photoconductive particles by means of a recrystallized bridge or junction therebetween, thereby producing low resistance electrical bridging connections between neighboring photoconductive material of the matrix forming the photoconductive layer 5.

The surface of the photoconductive layer 5 which faces the chargeretentive surface 9 of the paper 8 is relatively smooth, having a surface ripple less than 5 microns. The surface ripple is defined as the vertical distance between adjacent peaks and valleys in the surface of the photoconductor. Although the glass binder 16 completely coats the surface of the photoconductive particles 15 at the exposed surface of the photoconductive layer 5, the thickness of such glass coating is only on the order of a micron or less and does not interfere with proper operation of the photoconductive layer 5. Photoconductive layers 5 produced in accordance with the teachings of the present invention and found to be resistant to abrasion, and to be mechanically strong for producing electrographic images of acceptable photographic quality.

Figure 3:
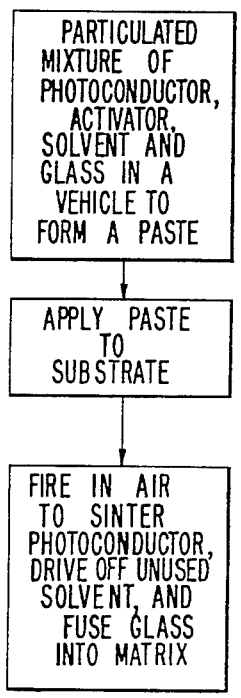
FIG. 3 is a flow diagram, in block diagram form, depicting the method of the present invention for fabricating the photoconductive layer of the present invention.

Referring now to FIG. 3, there is shown a flow diagram, in block diagram form, depicting the method for fabricating photoconductive layers 5 according to the present invention. Briefly, the method for producing the photoconductive layer 5 comprises the steps of, mixing together the powdered photoconductor and powdered lead sealing glass in the presence of suitable photoconductor activators and a solvent or fusing agent for the photoconductor. The powdered glass, photoconductor, activator and fusing agent are dispersed in a suitable liquid vehicle to form a paste and applied by a doctor blade or by spraying or by painting onto the transparent conductive electrode layer 6 as carried upon the glass substrate 7. The substrate containing the coating is then placed in an air furnace and heated to a temperature of the order of 600° C for approximately 15 minutes. The resultant photoconductive layer is then allowed to cool to room temperature. A conductor may then be painted onto the side edge of the substrate member to make contact with the optically transparent conductive electrode 6 and the photoconductive plate is then ready for use.

Suitable photoconductive materials include sulphides, tellurides, selenides and sulphoselenides of zinc or cadmium. Suitable activator elements include a halide plus copper/or silver. Suitable solvents for the photoconductor include halides of cadmium or zinc. Suitable vehicles for the powdered mixture include ethyl alcohol and xylene. Suitable glasses include the lead sealing glasses having a softening temperature between 50° and 250° C below the temperature at which the mixed particles are heated for melting the solvent. The glass particles preferably comprise between 10 and 45% by weight of the particulated photoconductive substance exclusive of the glass particles. That is, the proportion of the glass particles in between about 9 and 31% by weight of the total composition of glass plus the photoconductive substance. In a preferred embodiment, the sealing glass has a softening point of approximately 150° C below the temperature at which the particulated layer is fired in the furnace.

In a specific example of a method for forming the photoconductive layer 5 of the present invention, an intimate mixture is formed of 75 grams of cadmium sulphide, 22.5 grams of powdered sealing glass, 0.075 grams of $CuCl_2 \cdot 2H_2O$ and 11.25 g of dry $CdCl_2 \cdot 2.5H_2O$. A suitable cadmium sulphide powder is high purity powder obtained from Gallard Schlesingler Chemical Company of Carle Place, N.Y., Batch No. B7649. A suitable powdered sealing glass is No. 7570 of Corning Glass Works, Corning, New York, having a powder size corresponding to 325 mesh. The $CuCl_2 \cdot 2H_2O$ is preferably added as 15 ml of a solution of 0.005 g/ml of ethyl alcohol. Cadmium chloride is preferably prepared by heating the cadmium chloride at a temperature in excess of 100° C in a 50 ml glass beaker for 30 minutes and then adding ethyl alcohol until a smooth paste is obtained. Approximately 25 ml of ethyl alcohol will result in a smooth paste.

The cadmium sulphide, lead sealing glass, copper chloride and cadmium chloride are then all mixed together in 130 ml of ethyl alcohol plus 130 ml of xylene. 25 cylindrical milling balls are added in a 16-oz. glass jar and the mixture is ball-milled for 48 hours to produce a smooth paste. The smooth paste is then applied to a thickness of approximately 20 to 100 microns thick as by a doctor blade or by spraying over the transparent conductive coating 6 on a Corning 7760 borosilicate glass plate having a thickness of approximately 0.250 inch. The coated glass plate is then placed in a furnace operating in air at 600° C for 15 minutes and then allowed to cool to room temperature. The resultant photoconductive layer is then ready for use. For spraying, a water suspension comprising 130 ml of water is substituted for the xylene and then the cadmium chloride need not be introduced in paste form.

During the firing step, the cadmium chloride melts, dissolving the copper salt and some of the cadmium sulphide. In the molten solution, ion exchange chemical reaction takes place in the presence of the inert molten glass. In these chemical reactions, copper activates the photoconductive cadmium sulphide material. In addition, an ion exchange reaction occurs wherein chlorine ions enter the cadmium sulphide lattice to poduce further activation of the photoconductive material. Also the cadmium chloride acts as a fusing agent for promoting conductive bridging connections between the adjacent crystallite particles of the photoconductive material.

Some evaporation of the molten cadmium chloride occurs during firing and cadmium sulphide recrystallizes at the junctions between adjacent cadmium sulphide particles. The cadmium sulphide of the layer has incorporated therein activator proportions of copper and chlorine. When substantially all of the unused cadmium chloride has evaporated, the cadmium sulphide particles are interrelated with one another, forming a substantially continuous polycrystalline layer of electrically connected particles on the glass plate. The resultant layer is firmly adherent to the thin oxide on the transparent substrate.

The lead sealing glass has a softening temperature of approximately 150° lower than the firing temperature of 600°. The sealing glass is inert to the ion exchange and chemical reactions occurring between the copper and the cadmium chloride and cadmium sulphide. The glass in the final product provides a binder disposed in the interstitial spaces between the crystalline material of the photoconductive matrix. The glass imparts mechanical strength and abrasionresistant characteristics to the resultant photoconductive layer 5. The binder glass is electrically inert as contrasted with prior organic binders which have reduced the quantum conversion efficiency of photoconductive plates.

In place of cadmium sulphide, sulphides, tellurides, selenides and sulphoselenides of zinc or cadmium may be used. Cadmium sulphide and its equivalents will hereinafter be referred to as the host crystal.

Cadmium chloride is introduced into the mixture to act as a solvent for the host crystal. In addition to cadmium cloride, other halides of cadmium or zinc may be used such as, for example, bromides or iodides of cadmium or zinc may be employed. Instead of copper, silver may be introduced into the host crystal as the activator. The proportion of glass by weight of the hose crystal preferably falls within the range of 10 to 45% (by weight exclusive of the glass), with 30% being especially desirable. Alternatively, the proportions of glass particles may be expressed as a percentage of the total composition, in which case the range is between about 9 and 31%, 23% being preferred.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

I claim:

1. An electrophotographic plate which is capable of forming a charge image pattern in response to and in correspondence with a photon image comprising:
   a photoconductive layer comprising electrically connected photoconductive particles of crystalline material bound together by glass disposed in interstices between the particles;
   the glass comprising less than 40% by weight of the total material of the layer;
   the photoconductive particles being selected from the group consisting of sulphides, tellurides, selenides and sulphoselenides of a material selected from the group consisting of zinc and cadmium, and containing activator proportions of a halide and activator proportions of a metal selected from the group consisting of copper and silver.

2. The electophotographic plate of claim 1, wherein the photoconductive particles of crystalline material are cadmium sulphide and the activator is chloride and copper.

3. The electrophotographic plate of claim 1, wherein the glass comprises 23% by weight of the layer.

4. The electrophotographic plate of claim 1, together with a substrate having a conductive surface, the layer being bonded to the conductive surface.

5. The electrophotographic plate of claim 1, wherein the glass is lead sealing glass.

6. The electrophotographic plate of claim 1 wherein one surface of the layer is free of direct electrical contact with a conductive medium.

7. The electrophotographic plate of claim 1 wherein the plate is responsive to a d.c. voltage producing a brief and relatively transient flow of electrons within said plate.

8. The electrophotographic plate of claim 7 wherein the glass comprises between about 9 and 31% by weight of the total material of the layer.

9. A method for manufacturing a photoconductive layer for an electrophotographic device comprising the steps of:
   forming a layer comprising particles of glass mixed together with particles of photoconductive crystalline material, the photoconductive material being selected from the group consisting of sulphides, tellurides, selenides and sulphoselenides of a material selected from the group consisting of zinc and cadmium, the particles of glass comprising less than 40% by weight of the photoconductive layer inclusive of the glass;
   firing the layer to soften the glass to effect disassociation of some photoconductive material; and lowering the temperature to effect recrystallization of some photoconductive material, whereby the resulting photoconductive material is caused to be in the form of crystalline particles electrically interconnected with each other, the resolidified glass serving to bond the material of the layer into a solid mass with glass disposed in interstices between the particles.

10. The method of claim 9 wherein solvent is added to the initial mixture of inorganic material and photoconductive crystals.

11. The method of claim 9 wherein the glass is lead sealing glass.

12. The method of claim 9 wherein the glass comprises between about 9 and 31% by weight of the photoconductive layer inclusive of the glass.

13. The method of claim 12 wherein the particles of glass comprise about 23% by weight of the photoconductive crystals inclusive of the glass particles.

14. The method of claim 12, wherein the photoconductive material is milled cadmium sulphide.

15. The method of claim 14 wherein the layer includes activator proportions of a halide and of a metal selected from the group consisting of copper and silver which are subsequently included in the photoconductive material.

16. The method of claim 15 wherein the activator is chloride and copper.

17. A sintered photoconductive device capable of use as an electrophotographic plate when a brief and relatively transient direct current flows within it, said device comprising:
a first conductive electrode;
a sintered photoconductive element selected from the group consisting of sulphides, tellurides, selenides, and sulphoselenides of a material selected from the group consisting of zinc and cadmium disposed in electrical contact with said first electrode; and
an inorganic electrically nonconductive, solid impregnant disposed in the pores of said element and comprising less than 40% by weight of the total material of said element including said impregnant.

18. A photoconductive device as in claim 17 wherein said impregnant comprises between about 9 and 31% by weight of said element inclusive of said impregnant.

19. A photoconductive device as in claim 18 wherein said impregnant is glass.

20. In a photoconductive device capable of use as an electrophotographic plate when a brief and relatively transient direct current flows within it, said device including a sintered photoconductive element having pores, the improvement comprising an inorganic, electrically nonconductive, solid impregnant disposed in and partially filling said pores.

21. In a photoconductive device capable of use as an electrophotographic plate when a brief and relative transient direct current flows within it, said device including a sintered photoconductive element having pores, the improvement comprising an inorganic, electrically non-conductive, solid impregnant disposed in said pores and comprising less than 40% by weight of the total material of said element including said impregnant.

22. A photoconductive device in accordance with claim 20 in which said impregnant is transparent to the radiation to which said element is sensitive.

23. A photoconductive device in accordance with claim 20 in which said impregnant is substantially inert to the ambient atmosphere and to said element.

24. A photoconductive device in accordance with claim 21 in which said impregnant fully fills said pores.

25. The photoconductive device of claim 17 wherein said impregnant comprises between about 9 and 31% by weight of the total material of said element inclusive of said impregnant.

26. A photoconductive device as in claim 20 wherein said impregnant is glass.

27. A photoconductive device as in claim 26 wherein said glass comprises less than 40% by weight of said element inclusive of said glass.

28. A method for manufacturing an electrophotographic plate comprising the steps of:
providing a substrate;
forming a stratum on the substrate from a reasonably uniform liquid-like mixture including particles of glass, particulated photoconductive crystals and a flux, the crystals selected from the group consisting of sulfides, tellurides, selenides, and sulfoselenides of a material selected from the group consisting of zinc and cadmium, the particles of glass comprising between about 9% and 31% by weight of the photoconductive layer inclusive of the glass;
firing the substrate with said stratum thereon to simultaneously soften the particles of glass and flux; and
lowering the temperature of the substrate to cause the softened glass thereon to solidify and to create a bound relationship among the crystals and to the substrate within the solidifed glass, the particles of photoconductive crystals being positioned relative to each other in said glass as to result in electrical pathways thereamong so as to make said layer usable as an electrophotographic plate, the unused flux, if any, having been evaporated.

29. An electrophotographic plate suitable for use in simultaneous charge transfer electrophotography, wherein the application of a d.c. voltage produces a brief and relatively transient flow of electrons within said plate, comprising:
a photoconductive layer comprising electrically interconnected photoconductive particles of crystalline material bound together by inorganic glass disposed in interstices between the particles;
the glass comprising between about 9% and 31% by weight of the total material of the layer;
the photoconductive particles being selected from the group consisting of sulphides, tellurides, selenides and sulphoselenides of a material selected from the group consisting of zinc and cadmium, and containing activator proportions of a halide and activator proportions of a metal selected from the group consisting of copper and silver.

* * * * *

UNITED STATES PATENT OFFICE    Page 1 of 2
CERTIFICATE OF CORRECTION

Patent No. 4,053,863            Dated October 11, 1977

Inventor(s) Guy A. Marlor

It is certified that error appears in the above-identified patent and that said Letters Patent are hereby corrected as shown below:

In the Abstract, line 12, "are" should be deleted;
Column 1, line 13, "cadmium" is misspelled;
          line 35, "photoconductive" is misspelled;
          line 52, "is" should be --it--;
Column 2, line 12, after "activator" insert --proportions of a halide plus activator proportions of a metal selected from the group consisting of copper and silver--;
          line 13, "interstitially" is misspelled;
          line 28, "sulphide" should be pluralized;
          line 36, "particle" should be pluralized;
Column 3, line 4, there should be a comma after "transparency";
          line 6, "this" should be --thin--;
          line 59, before "matrix" insert --of the--;
          line 67, "chargeretentive" should be hyphenated;
Column 4, line 10, "and" should be --are--;
          line 49, "in" should be --is--;
Column 5, line 45, "thin" should be --tin--;
          line 53, before "crystalline" insert --interconnected--
          line 55, "abrasionresistant" should be hyphenated;
          line 66, "chloride" is misspelled;
Column 6, line 2, "hose" should be --host--;
          line 3, after "10" insert --%--;
          line 8, after "9" insert --%--;

UNITED STATES PATENT OFFICE
CERTIFICATE OF CORRECTION

Patent No. 4,053,863  Dated October 11, 1977

Inventor(s) Guy A. Marlor

It is certified that error appears in the above-identified patent and that said Letters Patent are hereby corrected as shown below:

Claim 8, line 2, after "9" insert --%--;
Claim 12, line 2, after "9" insert --%--.

Signed and Sealed this

Fourteenth Day of November 1978

[SEAL]

Attest:

RUTH C. MASON
Attesting Officer

DONALD W. BANNER
Commissioner of Patents and Trademarks